United States Patent [19]

Watai et al.

[11] 4,393,120

[45] Jul. 12, 1983

[54] PLASTIC COATED WITH GOLDEN EVAPORATED FILM

[75] Inventors: Haruhisa Watai, Kariya; Hiroyuki Furuta, Kounan; Akira Kawamoto, Nagoya, all of Japan

[73] Assignee: Yuken Industry Co., Ltd., Kariya, Japan

[21] Appl. No.: 294,030

[22] Filed: Aug. 18, 1981

[30] Foreign Application Priority Data

Sep. 26, 1980 [JP] Japan .................. 55-134739
Jan. 27, 1981 [JP] Japan .................. 56-10510

[51] Int. Cl.³ .................. B32B 27/08; B32B 33/00
[52] U.S. Cl. .................. 428/457; 428/458;
428/425.8; 428/423.3; 428/461; 428/463;
428/472; 428/480; 428/425.6; 428/423.5;
428/423.7; 428/424.6; 428/424.7; 428/424.8;
428/425.1; 427/125
[58] Field of Search ............... 428/461, 472, 463, 480,
428/423.3, 458, 425.8, 457

[56] References Cited

U.S. PATENT DOCUMENTS

| 3,440,087 | 4/1969 | Kamal et al. | 428/425.8 |
| 3,864,153 | 2/1976 | Enomoto | 428/425.8 X |
| 4,115,619 | 9/1978 | Kurfman et al. | 428/425.8 X |
| 4,148,967 | 4/1979 | Satoh et al. | 428/425.8 X |
| 4,252,862 | 2/1981 | Nishida | 428/472 X |
| 4,268,570 | 5/1981 | Imanaka et al. | 428/425.8 X |

Primary Examiner—P. Ives
Attorney, Agent, or Firm—Armstrong, Nikaido, Marmerstein & Kubovcik

[57] ABSTRACT

In a plastic coated with metal evaporated film comprising a primary coated layer, a golden evaporated film layer and a last coated layer constituted on the surface of a plastic substratum in the order from the bottom, golden evaporated film layer is made the of Cu - Al - Sn alloy or Cu - Zn - Sn alloy mainly composed of Cu and applicable to trim of automobiles, living apparatus and effects as decorative members.

4 Claims, 1 Drawing Figure

PLASTIC COATED WITH GOLDEN EVAPORATED FILM

BACKGROUND OF THE INVENTION

1. Field of the Invention

The present invention relates to plastics coated with golden evaporated film applicable to trim of automobiles, decorative parts and the like.

2. Description of the Prior Art

Demand for plastics coated with golden evaporated film is now rising in the inside and outside of the country from the standpoint of gorgeousness, luxuriousness and remarkableness. Gold, as material for this golden evaporated film is not practical because it is liable to be flawed as well as is expensive, so that brass (Cu-Zn alloy) is used instead. However, the golden evaporated film made from brass is liable to discolor and causes troubles in corrosion resistance, weather-proof, etc, so that it has been unsuitable especially for use as outer trimming parts.

SUMMARY OF THE INVENTION

An object of the present invention is to provide a plastic coated with golden evaporated film having a colortone and appearance equal to or higher than that of the golden evaporated film made from brass and further being superior in discoloring resistance, corrosion resistance and weather-proofing to that of the golden evaporated film made from brass.

Another object of the present invention is to provide a plastic coated with golden evaporated film fully bearable in outdoor use.

The present invention is directed to plastics coated with golden evaporated film made of Cu-AL-Sn alloy or Cu-Zn-Sn alloy mainly composed of Cu.

BRIEF DISCRIPTION OF THE DRAWING

The FIGURE is a partial section of a plastic coated with golden evaporated film.

DESCRIPTION OF THE PREFERRED EMBODIMENTS

Figure 1:
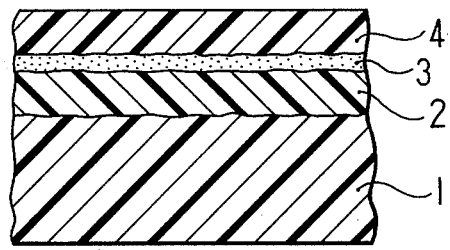

The invention will now be explained in detail as below.

On the surface of a plastic substratum 1, a primary coated layer 2, a golden evaporated film layer 3 and a last coated layer 4 are constituted in the order from the bottom.

As material for the plastic substratum 1, elastomeric material such as rubber and polyurethane elastomer and plastic material such as ABS (acrylonitrile-butadiene-styrene) resin, vinyl chloride resin, PP (polypropylene) resin, urea resin, melamine resin and all sorts of material such as wood, glass, ceramics, etc. can be demonstrated. Wherein, when using high-polymer material having fexibility such as elastomeric material and soft plastic material, there is no need to change design of plastics for every form of to-be-attached members, and plastics for wide use universality can be attained.

The primary coated layer 2 can be attained by coating primary resin of polyester, acrylics, polyurethane, etc. with spraying or brushing and heating and drying to 8~15 μm thickness after steam washing or spray cleaning the surface of the plastic substratum 1 with fluoro solvent such as trichlorotrifluoroethane.

The golden evaporated film layer 3 is formed to 500~1500 Å thickness by sputtering, ion-plating or vacuum evaporation of the following compositions on the primary coated layer 2.

(A) Cu-Al-Sn alloy

This alloy is composed of 5~15 wt% Al, 3~20 wt% Sn, below 6 wt% impurity and the balance 75~90 wt% Cu.

Wherein: if Cu is below 75 wt% and Al is above 15 wt%, the alloy will be whitish and cannot be called as the gold color. On the other hand, if Cu is above 90 wt% and Al is below 15 wt%, the alloy will be reddish and cannot be called as the gold color. And, if Sn is above 20 wt%, brittleness of evaporated film will be remarkably increased and if Sn is below 3 wt%, corrosion resistance of the evaporated film will be decreased and neither is desirable. If the impurity is above 6 wt%. there will be caused trouble in corrosion resistance of the evaporated film like the case where Sn is below 3 wt%. The chief elements of the impurity are Fe, Ni, etc.

(B) Cu-Zn-Sn alloy

This alloy is composed of 20~45 wt% Zn, 2~15 wt% Sn, below 0.5 wt% impurity and the balance 50~70 wt% Cu. Wherein: if Cu is below 50 wt% and Zn is above 45 wt%, the alloy will be whitish and cannot be called as the gold color. On the other hand, if Cu is above 70 wt% and Zn is below 20 wt%, the alloy will be reddish and cannot be called as the gold color. And, if Sn is above 15 wt%, brittleness of the evaporated film will be remarkably increased and if Sn is below 2 wt%, corrosion resistance of the evaporated film will be decreased and neither is desirable. If impurity is above 0.5 wt%, there will be caused a trouble in corrosion resistance of the evaporated film like the case where Sn is below 2 wt%. The chief elements of the impurity are Fe, Pb, Sb, etc.

And, in case of sputtering, evaporated film whose composition is identical to that of the alloy is formed, However, in case of ion-plating and vacuum evaporation, it is difficult to form evaporated film identical to the composition of the alloy due to the difference of evaporating temperatures of respective elements because the alloy is heated and evaporated. Therefore, the evaporated film of the present invention is most desirably formed by sputtering.

Sputtering condition is usually as follows:

Degree of Vacuum: $3 \times 10^{-4} \sim 1 \times 10^{-5}$ Torr,
Argon pressure: $1 \times 10^{-3} \sim 1 \times 10^{-4}$ Torr,
Voltage: 350~600 V,
Current density: 1~5 A/dm$^2$.

Wherein: if the degree of vacuum is above $3 \times 10^{-4}$ Torr, the color tone of sputtered film (evaporated film) will be darkened. On the other hand, if the degree of vacuum is below $1 \times 10^{-5}$ Torr, it will take a long time to attain said vacuum, so that it is not practical. And, if the argon pressure is above $1 \times 10^{-3}$ Torr, luster of sputtered film will be tarnished. On the other hand, if the argon pressure is below $1 \times 10^{-4}$ Torr, it will be difficult to maintain discharge. If the voltage is below 350 V, discharge will be unstable. On the other hand, if the voltage is above 600 V, current efficiency will be decreased and undesirable. And, if the current density is below 1 A/dm$^2$, the forming rate of sputtered film will be so slow that it is impractical. On the other hand, if the current density is above 5 A/dm$^2$, physical properties of the sputtered film will be lowered.

The last coated layer 4 is attained by spraying or brushing transparent final resin such as polyester, acrylic and polyurethane on the metallic evaporated film layer 3 and heating and drying to 10~20 μm thickness.

Wherein, in case where corrosion resistance and weather-proofing is especially required as outer trimming parts, 0.1~1.0 wt% of benzotriazole or its derivative is blended as antiseptics into the final resin.

As the above mentioned antiseptics, 1, 2, 3-benzotriazole, 4-methyl-benzotriazole, 5-methyl-benzotriazole, 4, 5, 6, 7-tetrahydro-benzotriazole, etc. can be demonstrated, among which 1, 2, 3-benzotriazole is most effective. And, in the additive quantity of anticeptics, below 0.1 wt% cannot attain enough anti-corrosive effect and even above 1.0 wt% can make no difference as compared with below 1.0 wt% and resolution of antiseptics into resin becomes difficult.

Examples and Comparisons will be demonstrated in the following to confirm the effect of the present invention.

For test pieces, all pieces are size 50 mm × 100 mm × 3 mm, moldings of ABS resin (Diapet 300 M <trade name> manufactured by Mitsubishi Rayon Co., Ltd.) have been used.

For the primary coated layer, polyurethanic resin has been used in Examples 1~3, 6, 8~10, 13~15 and Comparisons 1 and 2, and acrylic resin has been used in Examples 4, 5, 7, 11, 12, 16, 17 and sprayed and dried so as to attain 10~13 μm thickness.

For the last coated layer, transparent acrylic resin has been used in respective examples and comparisons and sprayed and dried so as to attain 10~13 μm thickness. However, 0.2 wt% 1, 2, 3 benzotriazole in Examples 6, 13~15 and Comparison 2, 0.2 wt% of 5-methyl-benzotriazole in Example 16 and 0.5 wt% of 4-methyl benzotriazole in Example 7 17 are contained in the last resin, respectively.

The composition in respective examples and comparisons of the golden evaporated film are as shown in Table 2 and the sputtering condition is as follows:

Examples 1~3, 6 and Comparison 1~2
Degree of Vacuum: $1 \times 10^{-5}$ Torr,
Argon pressure: $5 \times 10^{-4}$ Torr,
Voltage: 450 V,
Current density: 3 A/dm$^2$
Examples 4~5, 7
Degree of Vacuum: $5 \times 10^{-5}$ Torr
Argon pressure: $3 \times 10^{-4}$ Torr,
Voltage: 500 V,
Current density: 2 A/dm$^2$
Examples 8~10, 13~15
Degree of Vacuum: $1 \times 10^{-5}$ Torr,
Argon pressure: $5 \times 10^{-4}$ Torr
Voltage: 500 V,
Current density: 3 A/dm$^2$
Examples 11, 12, 16, 17
Degree of Vacuum: $3 \times 10^{-5}$ Torr
Argon pressure: $3 \times 10^{-4}$ Torr
Voltage: 500 V
Current density: 2 A/dm$^2$ And, the test for physical properties is conducted on the following items and ① the external appearance and ② peeling by taping test on cross-cut are observed after each test. However, with respect to item(e) of the following test, observation is limited to the exterual appearance.

(a) Water proofing test . . . immersed in 40° C. city water for 240 hr.
(b) heat cycling test . . . one cycle "80° C.×1 hr→room temperature×30 min→−30° C.×1 hr→room temperature×30 min." is repeated 3 cycles.
(c) salt spray test . . . for 240 hr in accordance with the Japanese Industrial standards (JIS) Z-2371
(d) CASS tset . . . one cycle 16 hr in accordance with the Japanese Industrial standards (JIS ) D-0201 is repeated 3 cycles.
(e) accelerated weather-proofing test . . . using a weather meter (standard Sunshine Super Long Life Weather meter <trade name> manufactured by Suga Testing Machine Manufacturing Co. Ltd.), one cycle 60 min (inclusive of spraying 18 min) has been repeated until an abnormal sign is shown on the external appearance.

The result of each test is as shown in Table 1.

As shown in Table 1 in the salt spray test in case of the last coating resin without containing antiseptics (Examples 1~5, 8~12 and Comparison 1), Comparison 1 discolored and corroded after about 96 hours, however, Examples 2, 4, 5, 8, 9, 11, discolored slightly after 200 hours and the rest showed no abnormal sign even after 240 hours.

In the weather-proofing test, Comparison 1 clouded after 104 hours, however, Examples 2, 4, 5, 8, 9, 11 clouded after 200 hours and Examples 1, 3, 10, 12 clouded after 300 hours.

On the other hand, in case of the last coating resin containing antiseptics (Examples 6, 7, 13~17, Comparison 2) Comparison 2 discolored after 172 hours, however, all Examples showed no abnormal sign even after 240 hours in the salt spray test. Also in weather-proofing test, Comparison 2 clouded locally after 300 hours, however, all examples showed no abnormal sign after 600 hours.

And, all examples assume a fine gold color.

TABLE 1

| Test piece | | Water-proofing test | Heat cycling test | Salt spray test | CASS test | Accelerated Weather-proofing test |
|---|---|---|---|---|---|---|
| Example 1 | ① | 0 | 0 | 0 | x | Clouded locally |
| | ② | 0 | 0 | 0 | 0 | after 300 hr |
| Example 2 | ① | 0 | 0 | x (200 hr) | x | Clouded locally |
| | ② | 0 | 0 | 0 | 0 | after 200 hr |
| Example 3 | ① | 0 | 0 | 0 | x | Clouded locally |
| | ② | 0 | 0 | 0 | 0 | after 300 hr |
| Example 4 | ① | 0 | 0 | x (200 hr) | x | Clouded locally |
| | ② | 0 | 0 | 0 | 0 | after 200 hr |
| Example 5 | ① | 0 | 0 | x (200 hr) | x | Clouded locally |
| | ② | 0 | 0 | 0 | 0 | after 200 hr |
| Example 6 | ① | 0 | 0 | 0 | 0 | Shown no abnormal |
| | ② | 0 | 0 | 0 | 0 | sign after 600 hr |
| Example 7 | ① | 0 | 0 | 0 | 0 | Shown no abnormal |

TABLE 1-continued

|  |  | Test item | | | | |
|---|---|---|---|---|---|---|
| Test piece | | Water-proofing test | Heat cycling test | Salt spray test | CASS test | Accelerated Weather-proofing test |
| Example 8 | ② | 0 | 0 | 0 | 0 | sign after 600 hr |
| | ① | 0 | 0 | x (200 hr) | x | Clouded locally |
| | ② | 0 | 0 | 0 | 0 | after 200 hr |
| Example 9 | ① | 0 | 0 | x (200 hr) | x | Clouded locally |
| | ② | 0 | 0 | 0 | 0 | after 200 hr |
| Example 10 | ① | 0 | 0 | 0 | x | Clouded locally |
| | ② | 0 | 0 | 0 | 0 | after 300 hr |
| Example 11 | ① | 0 | 0 | x (200 hr) | x | Clouded locally |
| | ② | 0 | 0 | 0 | 0 | after 200 hr |
| Example 12 | ① | 0 | 0 | 0 | x | Clouded locally |
| | ② | 0 | 0 | 0 | 0 | after 300 hr |
| Example 13 | ① | 0 | 0 | 0 | 0 | Shown no abnormal |
| | ② | 0 | 0 | 0 | 0 | sign after 600 hr |
| Example 14 | ① | 0 | 0 | 0 | 0 | Shown no abnormal |
| | ② | 0 | 0 | 0 | 0 | sign after 600 hr |
| Example 15 | ① | 0 | 0 | 0 | 0 | Shown no abnormal |
| | ② | 0 | 0 | 0 | 0 | sign after 600 hr |
| Example 16 | ① | 0 | 0 | 0 | 0 | Shown no abnormal |
| | ② | 0 | 0 | 0 | 0 | sign after 600 hr |
| Example 17 | ① | 0 | 0 | 0 | 0 | Shown no abnormal |
| | ② | 0 | 0 | 0 | 0 | sign after 600 hr |
| Comparison 1 | ① | 0 | Δ | xx (96 hr) | x | Clouded locally |
| | ② | 0 | 0 | x | x | after 104 hr |
| Comparison 2 | ① | 0 | Δ | x (172 hr) | x | Clouded locally |
| | ② | 0 | 0 | 0 | 0 | after 300 hr |

Note:
In the external appearance 1;
0 ... no abnormal sign,
Δ ... a crack or cloud is observed,
x ... discolored,
xx ... corroded.
In the peeling by taping test on cross-cut 2;
0 ... no peeling,
x ... peeling is observed.

TABLE 2

| Examples & Comparisons | Elements | | | | |
|---|---|---|---|---|---|
| | Cu (wt %) | Al (wt %) | Sn (wt %) | Zn (wt %) | Impurity (wt %) |
| Example 1 | 76 | 5 | 15 | — | 4 |
| Example 2, 6 | 81 | 15 | 3 | — | 1 |
| Example 3 | 85 | 5 | 8 | — | 2 |
| Example 4, 7 | 85 | 10 | 4 | — | 1 |
| Example 5 | 90 | 6 | 3 | — | 1 |
| Example 8, 13 | 60 | — | 5 | 35 | — |
| Example 9, 14 | 55 | — | 8 | 37 | — |
| Example 10, 15 | 58 | — | 15 | 27 | — |
| Example 11, 16 | 70 | — | 2 | 28 | — |
| Example 12, 17 | 68 | — | 12 | 20 | — |
| Comparisons 1, 2 | 61 | — | — | 39 | — |

What is claimed is:

1. In a plastic article coated with a golden color evaporated metal film and comprising a plastic substrate, a primary coating layer provided on said substrate, a golden color evaporated metal film provided on said primary coating layer and an outer coating layer provided on said golden color evaporated metal film, the improvement wherein said golden color evaporated metal film is a Cu-Sn-Al alloy composed of 5-15 wt% Al, 3-20 wt% Sn, less than 6 wt% impurities and the balance 75-90 wt% Cu.

2. The plastic article of claim 1 wherein said plastic substrate is a high molecular weight polymer having flexibility, said golden color evaporated metal film is of the sputtered type and said outer coating layer is a resin containing 0.1 to 1.0 wt.% of benzotriazole or a derivative thereof.

3. In a plastic article coated with a golden color evaporated metal film and comprising a plastic substrate, a primary coating layer provided on said substrate, a golden color evaporated metal film provided on said primary coating layer and an outer coating layer provided on said golden color evaporated metal film, the improvement wherein said golden color evaporated metal film is a Cu-Zn-Sn alloy composed of 20-45 wt% Zn, 2-15 wt% Sn, less than 0.5 wt% impurities and the balance 50-70 wt% Cu.

4. The plastic article of claim 3, wherein said plastic substrate is a high molecular weight polymer having flexibility, said golden color evaporated metal film is of the sputtered type and said outer coating layer is a resin containing 0.1 to 1.0 wt% of benzotriazole or a derivative thereof.

* * * * *